United States Patent [19] [11] 4,297,680
Koeman [45] Oct. 27, 1981

[54] ANALOG WAVEFORM DIGITIZER

[75] Inventor: Henriecus Koeman, Edmonds, Wash.

[73] Assignee: John Fluke Mfg. Co., Inc., Mountlake Terrace, Wash.

[21] Appl. No.: 63,521

[22] Filed: Aug. 3, 1979

[51] Int. Cl.$^3$ ............................................. H03K 13/02
[52] U.S. Cl. ........................ 340/347 AD; 340/347 M; 358/138; 358/261; 364/112
[58] Field of Search .... 340/347 M, 347 SH, 347 AD; 328/151, 114, 132; 358/133, 138, 261; 364/112; 307/353

[56] References Cited

U.S. PATENT DOCUMENTS 3,816,815  6/1974  Schumann ...................... 324/102 X
4,210,904  7/1980  Renzel et al. .................. 364/507 X

OTHER PUBLICATIONS

Shoemaker et al., Digital Testing Oscilloscope— Troubleshooting, Eletronics, Mar. 16, 1978, pp. 105-112 + 3 sheets of specifications and cover sheet.
The Engineering Stall of Analog Devices, Inc., Analog-Digital Conversion Handbook, 6/1972, pp. I-98 to I-103.

Primary Examiner—Thomas J. Sloyan
Attorney, Agent, or Firm—Christensen, O'Connor, Johnson & Kindness

[57] ABSTRACT

A waveform digitizer particularly suitable for use in electronic test systems for analyzing and displaying analog signals is disclosed. A digitally derived reference voltage is compared with the analog signal to be digitized during a series of comparison sequences. Simultaneously with the start of each comparison sequence a digital clock is started. Each time the analog signal rises above, or drops below, the reference voltage a decision change detector produces an enable pulse. Each time an enable pulse occurs, a data word, having a portion related to the value of the digitally derived reference voltage and a portion related to the digital clock value, is stored and/or used to control a display. At the end of the first comparison sequence (determined when the digital clock value reaches a predetermined level) the reference voltage is incremented and a second comparison sequence started. These steps are repeated until the reference voltage reaches a predetermined level. The resulting set of digital words is digitized equivalent of the waveform of the analog signal.

10 Claims, 6 Drawing Figures

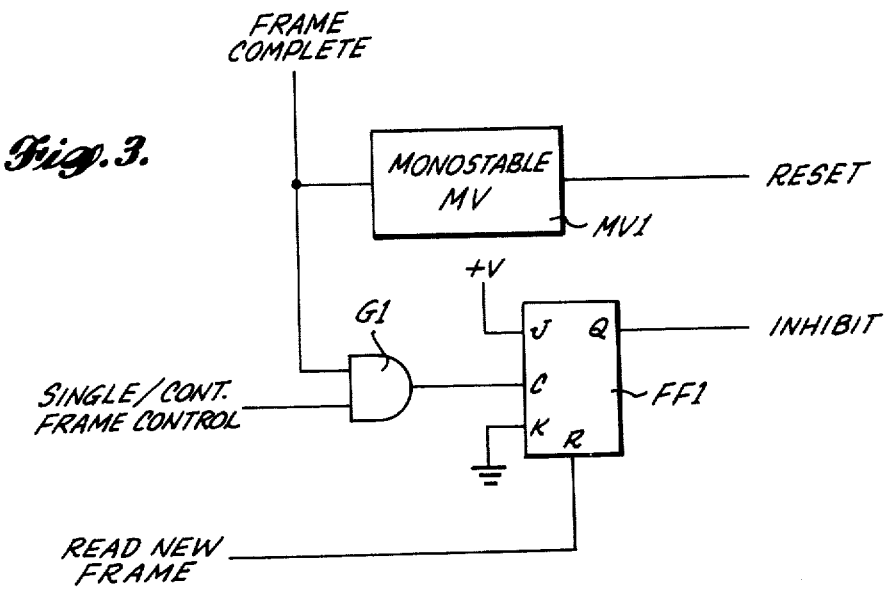
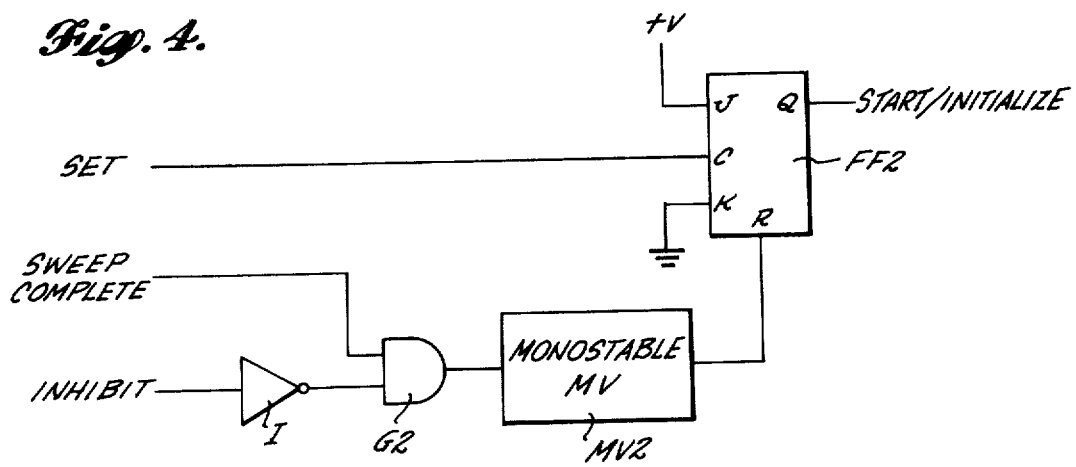

ANALOG WAVEFORM DIGITIZER

TECHNICAL AREA

This invention is directed to waveform conversion and, more particularly, to a waveform digitizer that is particularly suitable for use in electronic circuit test and analysis equipment.

BACKGROUND OF THE INVENTION

In general, electronic circuitry can be divided into two generally different classes of circuits-analog circuits and digital circuits. Originally, most electronic circuits fell into the analog class. However, in the last few decades a wide variety of digital circuits have been developed for use in various environments, particularly data processing environments. While digital circuits have found widespread use in the processing of data, most, if not all, data sources are analog in nature. Thus, it is necessary to convert measured or detected data from analog form into digital form prior to processing the data. As a result, many electronic systems include both analog and digital circuits.

In the past, separate test equipment has been utilized to test the digital and analog circuits of electronic systems. In this regard, logic analyzers have been developed for testing digital circuits. Logic analyzers test digital circuits by automatically producing one or more digital test signals, applying the digital test signals to a digital circuit to be tested and determining whether or not the digital circuit correctly processes the signals by analyzing either the output of the digital circuit or the signals occuring at predetermined circuit test points. Many logic analyzers are programmable so that a single logic analyzer can be utilized to test a wide variety of different types of digital circuits. Contrariwise, in the past testing analog circuits (regardless of whether or not they are combined with digital circuits in a combined electronic system) has required either the development of specialized automatic test equipment or the application of time consuming manual test procedures using standard test instruments, such as oscilloscopes, voltmeters, ammeters, etc., due to the lack of a single piece of equipment that can be programmed to automatically test in a rapid and efficient manner a wide variety of analog circuits. Obviously, it would be desirable to provide such test equipment. Even more desirable is a single piece of test equipment suitable for testing a wide variety of both analog and digital circuits. One of the problems with providing such a hybrid piece of test equipment has been the difficulty in providing an inexpensive circuit for digitizing analog waveforms, particularly a waveform digitizer that can be readily combined with programmable logic analyzers.

Therefore, it is an object of this invention to provide a waveform digitizer.

It is also an object of this invention to provide a waveform digitizer that is particularly suitable for use in analyzing analog signals.

It is still another object of this invention to provide a waveform digitizer that is relatively inexpensive, yet suitable for use in combination with digital logic analyzers to provide a hybrid analyzer suitable for analyzing both analog and digital signals.

In addition to being above to automatically analyze both digital and analog signals, it is also desirable to be able to display the signals being analyzed, particularly when the signal analysis determines that the circuit being tested is not operating satisfactorily. Such displays are usually provided so that an operator can more easily locate and identify the location of faults in a circuit under test. Usually such displays are produced on a cathode ray tube (CRT) display.

Therefore, it is a further object of this invention to provide a waveform digitizer suitable for producing signals adapted to control a display.

It is yet another object of this invention to provide a waveform digitizer suitable for use in analog and combined analog and digital signal analyzers adapted to analyze analog or both analog and digital signals, respectively, and display the signals being analyzed.

SUMMARY OF THE INVENTION

In accordance with this invention a waveform digitizer particularly suitable for use in combination with a digital logic analyzer to create a hybrid analyzer for analyzing signals produced by both analog and digital circuits is provided. The waveform digitizer digitizes analog signals by comparing a digitally derived reference voltage with the analog signal during a series of comparison sequences. Simultaneously with the start of each comparison sequence a digital clock is started. Each time the analog signal rises above, or drops below, the reference voltage a decision change detector produces an enable pulse. Each time an enable pulse occurs, a data word, having a portion related to the value of the digitally derived reference voltage and a portion related to the digital clock value, is stored and/or used to control a display. At the end of a first comparison sequency (determined when the digital clock value reaches a predetermined level), the reference voltage is incremented and a second comparison sequence started. The comparison sequences are repeated until the reference voltage reaches a predetermined level. The resulting set of digital words is a digitized equivalent of the waveform of the analog signal.

In the preferred form of the invention, the reference voltage is created by converting the digital output of an amplitude counter from digital form to analog form. When the reference voltage is to be incremented, the amplitude counter is incremented. The comparison sequences and, thus, the digital clock, are started at the same predetermined point in the analog signal waveform. The point can be chosen in accordance with the slope of the analog signal, the level of the analog signal or any other basis commonly used to control an X-Y display, such as an oscilloscope. If the analog signal is to be displayed, the digital clock signal is converted to analog form and controls the X axis position of the display, the reference voltage controls the Y axis position of the display and the enable pulses control the creation of an image, e.g., the emission of electrons from the electron gun. When the signal is to be stored, the enable pulses enable a memory to receive and store the digital word existing at the time each enable pulse is produced.

In one form, each time the write input of the memory is enabled by an enable pulse, the memory receives and stores the digital output of the clock and the digital output of the amplitude counter. In an alternative form, each time the write input of the memory is enabled by an enable pulse, the memory receives and stores the digital output of the clock and the output of a flip-flop that is placed in a predetermined state at the beginning of each comparison sequence and switched to the opposite state the first time the analog voltage passes through the reference voltage, remaining in the latter state during the remainder of the comparison sequence. In either form of the invention, each time the decision change detector produces an enable pulse, the memory address is incremented, whereby the data words defining the waveform are sequentially stored in the memory.

When the digital data words stored in the memory are to be read out for analysis or display purposes, the memory addresses are sequentially produced. Each time a new address is produced, the read out input of the memory is enabled to cause the memory to produce the stored data word located at the new address. In a case of a display, the read enable pulse also controls the creation of an image, which occurs at the X-Y position determined by the data word stored at the then existing address. In other words, the position of the image is controlled by the data words read out from the memory and the existence of the image is controlled by the pulse causing the position data words to be read out.

As will be readily appreciated from the foregoing summary by those skilled in the electronic test art, the invention provides a waveform digitizer that is particularly suitable for use in conjunction with a logic analyzer to provide a hybrid combination analyzer that can be used to analyze signals produced by both analog and digital circuitry. Alternatively, the waveform digitizer can be used in an analyzer dedicated to analyzing only analog signals. The waveform digitizer is particularly suitable for use in these environments because it is relatively inexpensive to produce and can be readily controlled by digital control system of the type generally used in logic analyzers, which control systems can be readily programmed to create a wide variety of tests. Further, the digital words defining the waveform can be readily analyzed with digital analysis systems of the type included in logic analyzers.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein:

FIG. 3 is a logic diagram of a frame controller suitable for use in the preferred embodiment of the invention illustrated in FIG. 2;

FIG. 4 is a logic diagram of a hold off trigger circuit suitable for use in the preferred embodiment of the invention illustrated in FIG. 2;

DESCRIPTION OF THE PREFERRED EMBODIMENTS

Because the invention will be more easily understood if the type of display produced by a digitized waveform signal developed by the invention is first understood, prior to describing the preferred embodiments of the invention such a display is described. In this regard, attention is directed to FIG. 1, which is a simplified diagram of a waveform display produced on a Cartesian (X-Y) coordinate system, such as occurs on the face of a cathode ray tube display. As will be better understood from the following discussion, the analog signal whose waveform is to be digitized is repetitively compared with a series of reference voltages. Each comparison sequence starts at the same predetermined point in the analog signal waveform and lasts for a predetermined period of time. Assuming that the entire waveform is to be digitized, after each comparison sequence, the reference voltage is stepped and another comparison sequence occurs. The comparison sequences end when the reference voltage reaches a predetermined level.

The waveform is digitally defined by data words that define points where the analog signal voltage passes through the reference voltage. The points are determined by the value of the reference voltage at the time of crossing and the time at which the crossing occurs. The time of crossing is the elapsed time between the start of each comparison sequence and when the crossing(s) occur. The time of crossing corresponds to the sweep of an oscilloscope and controls the abscissa (X) axis position of the Cartesian coordinate display; and, the reference voltage level controls the ordinate (Y) axis position. As will be also better understood by the following description of a preferred embodiment of the invention, crossing time is derived from a digital clock.

Figure 1:
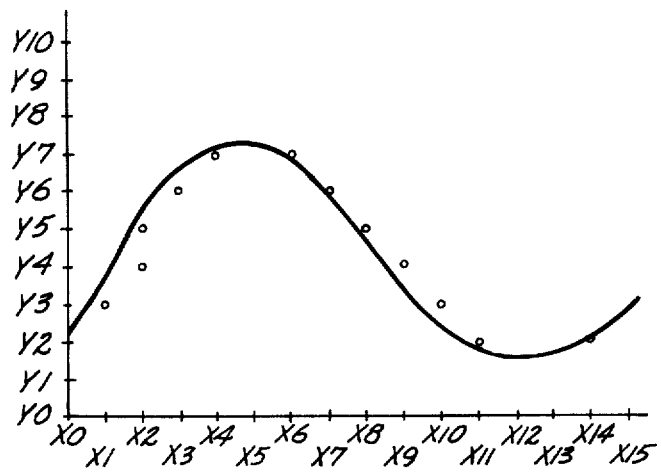
FIG. 1 is a waveform display used to describe the invention.

Since the time source is digital and the reference voltage is digitally derived, the X and Y axis positions controlled by these signals define a grid. In FIG. 1, the X axis is illustrated as having sixteen grid positions denoted X0–X15 and the Y axis is illustrated as having eleven grid positions denoted Y0–Y10. As noted above, FIG. 1 is a simplified view of the display system, as a result the number of grid positions is only by way of example. Preferably, the number used in an actual embodiment of the invention will be substantially higher-$2^8$ reference voltage level grid positions and $2^{10}$ time grid positions, for example. In any event, during a comparison sequence, the X-Y grid position data is used to control the display position of dots that are created each time the analog voltage of the waveform to be digitized rises above, or drops below, the reference voltage. More specifically, in the case of a cathode ray tube display, each time the analog signal voltage rises above, or drops below, the reference voltage, the electron gun of the cathode ray tube is energized. Such energization creates a dot at the reference voltage controlled vertical (Y) grid position and the digital clock controlled horizontal (X) grid position.

With the foregoing information in mind, the creation of the display illustrated in FIG. 1 will be readily understood. During the first comparison sequence the reference voltage is zero. This voltage corresponds to the Y0 grid line of the display. Since the entire analog signal voltage lies above zero, no image is created as the digital clock counts from X0 to X15. Thereafter, the reference voltage is stepped to the voltage corresponding to the Y1 grid line and the second comparison sequence occurs. Again, since the analog signal voltage lies entirely above Y1 reference voltage level, no dot images are produced. Consequently, after the clock has counted up to X15, the reference voltage is stepped to the voltage level corresponding to the Y2 grid line. Again no dot images are produced as the clock counts from X0 to X10. However, between X10 and X11, the analog signal voltage drops below the Y2 reference voltage level. As a result, at position X11, Y2 a dot display is produced. The clock continues to count and between time X13 and X14, the analog signal voltage rises above the reference voltage. Thus, at position X14, Y2 a second dot display is produced. After the clock counts to X15, the reference voltage is stepped to a voltage corresponding to the Y3 grid line and a fourth comparison sequence takes place. During the fourth comparison sequence, dots are created at positions X1, Y3 and X10, Y3. Next a comparison sequence occurs at a reference voltage corresponding to the Y5 grid line, then the Y6 grid line, etc., until the voltage corresponding to the Y10 grid line is reached. The result is a series of dots of the type illustrated in FIG. 1.

From viewing FIG. 1, it will be noted that the dot positions do not exactly define the waveform of the analog signal, which is shown by the solid line. As with any digital representation of an analog signal, the degree of display accuracy is a matter of resolution, which is determined by the separation between the grid positions. More specifically, as the separation between the reference voltage levels and the increment between time positions becomes smaller, resolution is improved. As a result, the displayed waveform will become close to an exact replica of the actual waveform of the analog signal when the grid separation distance is made very small. In this regard, as noted above, preferably, in an actual embodiment of the invention, the number of vertical grid positions will be on the order of $2^8$ (e.g., 256) and the number of horizontal grid positions will be on the order of $2^{10}$ (e.g., 1024). Even though such resolution will be adequate for most signal display purposes, truncation errors dependent upon when the analog signal actually crosses the reference level within the sample time period can be further improved by time shifting the display to the left, if desired. A simple time shift can be produced by substracting one-half of the time interval between the horizontal grid positions from the detected crossing point prior to apply the result to the display. The time interval between grid positions is, of course, the time interval between the clock pulses counted by the clock. That is, as will be appreciated from viewing FIG. 1, the actual display (the dots) are shifted to the right. Accuracy can be improved by shifting the display to the left by a time equal to one-half the time between the X axis grid positions of the display.

Figure 2:
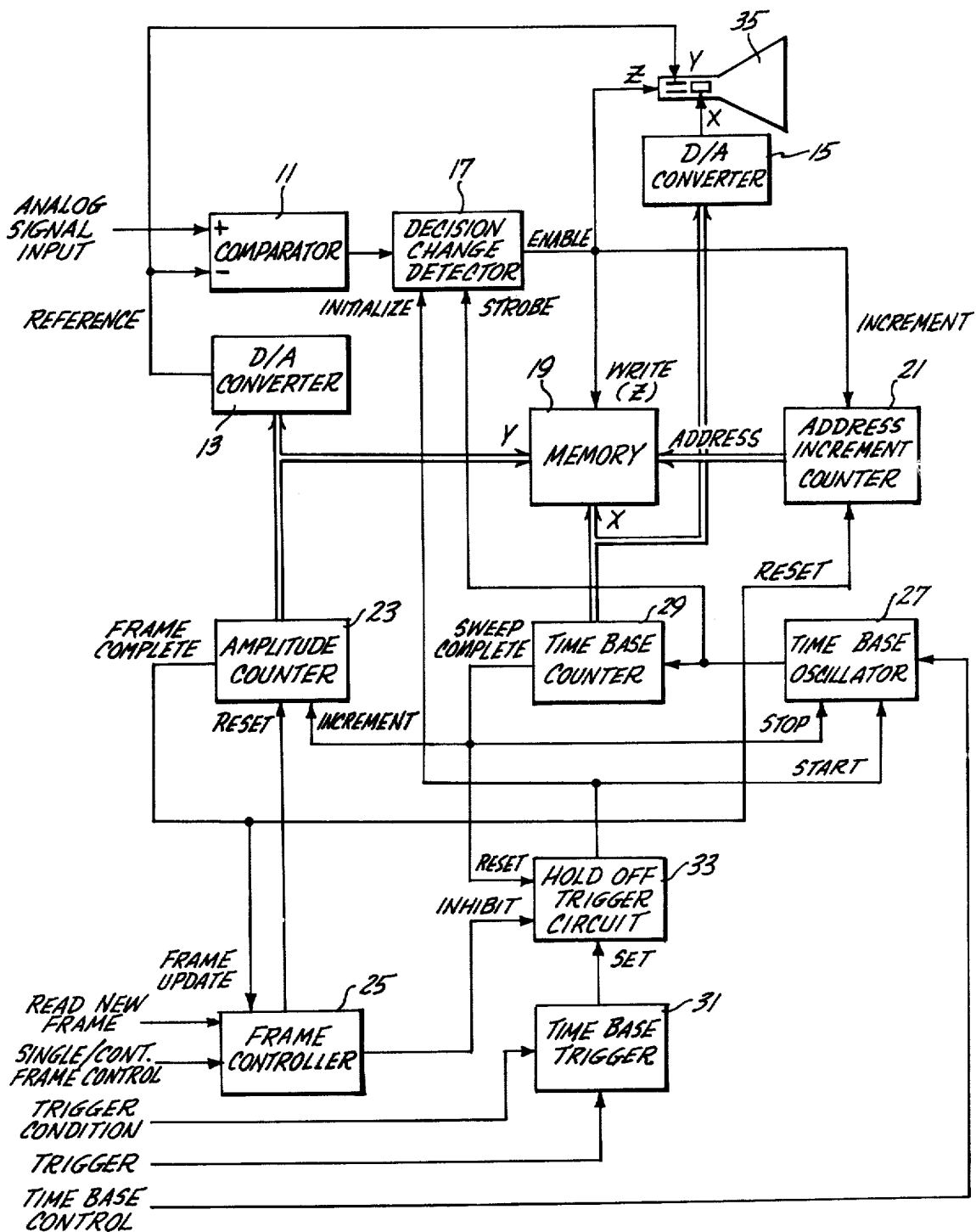
FIG. 2 is a block diagram of a preferred embodiment of the invention.

FIG. 2 is a block diagram of a preferred embodiment of the invention and comprises: a comparator 11; first and second digital-to-analog (D/A) converters 13 and 15; a decision change detector 17; a memory 19; an address increment counter 21; an amplitude counter 23; a frame controller 25; a time base oscillator 27; a time base counter 29; a time base trigger 31; a hold off trigger circuit 33; and, a cathode ray tube (CRT) 35.

The comparator 11 can be formed of any suitable component such as a conventional operational amplifier having inverting and noninverting inputs. The analog signal to be digitized is applied to the noninverting input of the comparator 11. The inverting input of the comparator is connected to the output of the first D/A converter 13, which produces the reference voltage in the manner hereinafter described. The reference voltage is also applied to the vertical deflection plates of the CRT 35 to control the vertical position of the display. (Conventional circuitry required to condition the reference voltage prior to applying it to the vertical deflection plates is not illustrated in FIG. 2 in order to avoid unnecessarily complicating the drawing and the description of the invention.)

The output of the comparator 11 is applied to the input of the decision change detector 17. The decision change detector 17 also receives INITILIZE pulses, produced by the hold off trigger circuit 33 in the manner hereinafter described, and STROBE pulses, produced by the time base oscillator 27 also in the manner hereinafter described. The decision change detector determines when the output of the comparator 11 changes state, i.e., goes from positive to negative or negative to positive and, in accordance therewith, produces an ENABLE pulse. Such changes occur, of course, when the analog signal voltage rises above, or drops below, the reference voltage. The decision change detector may, for example, comprise a two-stage shift register and an Exclusive OR gate connected to the output of the two stages to compare the state of the stages. The stages are strobed, i.e., shifted, by the STROBE pulses produced by the time based oscillator 27 each time a horizontal or X-axis grid shift takes place. As long as the output of the comparator 11 remains in the same state, the output of the shift register stages are the same, whereby the output of the Exclusive OR gate remains in a first (e.g., zero) binary state. However, when the output of the comparator changes state, and the change is shifted into the first stage of the shift register by a STROBE pulse, the stage outputs become different, whereby the output of the Exclusive OR gate changes binary states. The binary state change exists until the next STROBE pulse, at which time the outputs of the shift register stages again become the same, whereby the output of the Exlcusive OR gate returns to its first binary state. In this manner, an ENABLE pulse is produced on the output of the decision change detector each time the analog signal voltage rises above, or drops below, the reference voltage. The shift registers are, of course, initialized by the INITILIZE pulses.

The ENABLE pulses produced by the decision change detector 17 are applied to the write input of the memory 19; the emission control input of the CRT 35, via a suitable control system (not shown); and, the increment input of the address increment counter 21. Thus, each time the decision change detector 17 produces an ENABLE pulse, the memory 19 receives and stores the data on its signal input at the address present on its address input; the CRT 35 emits electrons for the length of the pulse; and, the address increment counter 21 is incremented.

The amplitude counter 23 produces a parallel digital output that is applied to the first D/A converter 13. Thus, the numerical count present on the output of the amplitude counter 23 controls the reference voltage level. Preferably, the output of the amplitude counter is an eight (8) bit binary signal. In addition to being applied to the first D/A converter 13, the output of the amplitude counter 23 is also applied to an eight (8) bit portion of the input of the memory 19, denoted in FIG. 2 as the Y input. Eight (8) bits are preferred because, practically, the oscilloscope display resolution that the typical human eye can satisfactorily observe corresponds to eight (8) bits.

The amplitude counter is incremented by the output of the time base counter 29. More specifically, the time base oscillator 27 produces a train of pulses whose frequency is controlled by a manually set TIME BASE CONTROL signal. The TIME BASE CONTROL signal may be controlled by the adjustment of an adjustable switch, for example. The pulses produced by the time base oscillator form the STROBE pulses applied to the decision change detector 17. The pulses produced by the time base oscillator are also applied to the input of the time base counter 29. The time base counter counts the pulses produced by the time base oscillator and, in accordance therewith, produces a parallel digital output.

The parallel digital output of the time base counter 29 is applied to the input of the second D/A converter 15, where it is converted into analog form. The analog output of the second D/A converter 15 is applied to the horizontal or X-axis deflection plates of the CRT 35 via a suitable signal conditioning circuit (not shown). In addition, the parallel digital output of the time base counter is applied to another portion of the input of the memory 19. The number of bits of this portion, denoted the X-input of the memory 19, is determined by the typical human eye resolution requirements of the CRT display horizontal axis, which resolution lies between 8 and 10 bits. (Additional storage may be added for time base expansion, if desired.) As a result, the X and Y inputs of the memory in their entirety comprises a 16-20 bit data word that entirely defines the X, Y positions of the display.

After the time base counter 29 has counted the number of pulses equal to the number of X-axis grid positions, the time base counter 29 produces a SWEEP COMPLETE pulse. The SWEEP COMPLETE pulse is applied to the increment input of the amplitude counter 23, the reset input of the hold off trigger circuit 33 and the stop input of the time base oscillator. As a result, each time the time base counter 29 counts the number of pulses required for a complete sweep along the X-axis of the display, the amplitude counter is incremented to raise the reference voltage to the next level, the hold off trigger circuit 33 is reset (in the manner hereinafter described) and the time base oscillator 27 stops producing pulses.

Each time the amplitude counter counts up to its preset maximum value it produces a FRAME COMPLETE pulse that is applied to an input of the frame controller 25 denoted the frame update input and to the reset input of the address increment counter 21. The frame controller 25 also receives an externally produced control signal denoted SINGLE/CONTINUOUS FRAME CONTROL. Preferably, the SINGLE/CONTINUOUS FRAME CONTROL signal is a binary signal whose level is controlled by a manually adjustable switch or remote control. The SINGLE/CONTINUOUS FRAME CONTROL signal controls whether or not FRAME COMPLETE pulses are to be used to reset the amplitude counter 23 and inhibit the hold off trigger circuit 33, or merely reset the amplitude counter 23. More specifically, when applied to the frame controller 25, the FRAME COMPLETE pulses produced by the counter form a frame update control signal. If a single frame of the analog signal is to be displayed (which occurs when the SINGLE/CONTINUOUS FRAME CONTROL signal is a first, e.g., one, binary state), upon the completion of one frame, the FRAME COMPLETE pulse causes the frame controller 25 to reset the amplitude counter and apply an inhibit signal to the hold off trigger circuit. In this situation, the inhibit signal remains in its inhibit state until an externally produced reset control signal, denoted READ NEW FRAME, is applied to the frame controller 25. Contrariwise, if the analog signal is to be repetitively digitized (which occurs when the SINGLE/CONTINUOUS FRAME CONTROL signal is in the. other, e.g., zero, binary state), the FRAME COMPLETE pulse only causes the frame controller 25 reset the amplitude counter 23.

In its least complex form, the frame controller 25 can be formed of a logic circuit of the type illustrated in FIG. 3, which comprises: a monostable multivibrator designated MV1; a two-input AND gate designated G1; and, a JK flip-flop designated FF1. FRAME COMPLETE pulses are applied to MV1 and to one input of G1. At the end of its time-out period MV1 produces the RESET pulses that are applied to the amplitude counter. Thus, a RESET pulse is produced a predetermined period of time after each FRAME COMPLETE pulse, whereby the amplitude counter is reset.

The SINGLE/CONTINUOUS FRAME CONTROL signal is applied to the second input of G1 and the output of G1 is connected to the clock (C) input of FF1. The J input of FF1 is connected to a positive voltage source designated +V and the K input of FF1 is connected to ground. the INHIBIT signal applied to the hold off trigger circuit occurs on the Q output of FF1; and, the READ NEW FRAME signal is applied to the reset (R) input of FF1. In operation, when the SINGLE/CONTINUOUS FRAME CONTROL signal is in its single frame (e.g., binary one) state, G1 is enabled. As a result FRAME COMPLETE pulses are applied to the clock input of FF1. Due to the way the J and K inputs of FF1 are tied high and low, respectively, FRAME COMPLETE pulses clock FF1 to a set state, whereby INHIBIT shifts high to inhibit the hold off trigger circuit in the manner hereinafter described. READ NEW FRAME pulses reset FF1, whereby INHIBIT drops low and the hold off trigger circuit is reenabled.

It is pointed out that the frame controller 25 may form part of an overall controller that functions to control other portions of the waveform digitizer herein described--such as controlling the reading out of data stored in the memory 19 to create or refresh the CRT display, for example. Further, if the waveform digitizer is incorporated in a hybrid analyzer adapted to analyze digital as well as analog signals, the frame controller could form part of an overall controller included in such a system.

The time base trigger 31 is essentially identical to an oscilloscope trigger circuit, except that, instead of initiating a sweep generator that produces a sawtooth sweep along the X-axis of the oscilloscope display, the time base trigger 31 produces a SET pulse that initiates the hold off trigger circuit (hereinafter described) when the sweep initiating conditions are met. In this regard, the time base trigger 31 receives a TRIGGER CONDITION signal which determines the input signal condition that must be met in order for the SET pulse to be produced. The chosen condition can be signal amplitude (TRIGGER LEVEL), signal slope (TRIGGER SLOPE), AC or DC coupling, or any other trigger condition commonly employed by oscilloscopes. The time base trigger also receives a TRIGGER signal, which may be the input signal or a suitably conditioned version of the input signal, or even an externally generated trigger signal. In any event, when the TRIGGER signal meets the trigger condition set by the TRIGGER CONDITION signal, the time base trigger produces a SET pulse. SET pulses are applied to the hold off trigger circuit 33 to control the triggering of the waveform digitizer as hereinafter described. In addition to inhibiting the operating of the waveform digitizer when the digitizier is in a single frame mode of operation and a single frame has been displayed, the hold off trigger circuit 33 also prevents SET pulses occurring during a sweep from retriggering the waveform digitizer to start a second sweep prior to the first sweep being completed.

As illustrated in FIG. 4, the hold off trigger circuit may be formed by: a JK flip-flop designated FF2; an inverter designated I; a two-input AND gate designated G2; and, a monostable multivibrator designated MV2. The J input of FF2 is connected to a positive voltage source designated +V and the K input is connected to ground. SET pulses produced by the time base trigger 31 are applied to the clock input of FF2. As a result, SET pulses clock FF2 into a set state. The Q output of FF2 is the START/INITILIZE signal applied to the time base oscillator 27 to start that oscillator and to the decision change detector 17 to initilize the decision change detector, both of which function in the manner previously described.

SWEEP COMPLETE pulses produced by the time base counter when it is full, as previously described, are applied to one input of G2. The INHIBIT signal produced by the frame controller 25 is applied through I to the other input of G2. The output of G2 is applied to the trigger input of MV2 and the output of MV2 is applied to the reset (R) input of FF2. As a result, as long as the INHIBIT signal is low or false, G2 is enabled, wereby SWEEP COMPLETE pulses reset FF2. This action allows subsequently occurring SET pulses to set FF2 and shift the START/INITILAZE signal from low to high. (It is, or course, the leading edge of the START/INITILIZE signal that starts the time base oscillator and initilizes the decision change detector.) Consequently, continuous frames are displayed when INHIBIT is low. Contrariwise, when INHIBIT is high (single frame mode of operation), G2 is disabled, whereby SWEEP COMPLETE pulses are prevented from being applied to MV2, whereby FF2 remains in a set state. As noted above, SET pulses occurring during a sweep do not start a new sweep. This result occurs because FF2 remains set until a sweep is complete.

Turning now to a summary of the operation of the waveform digitizer illustrated in FIG. 2; initially the amplitude counter 23 is reset to zero. This may occur as the result of the actuation of a manual reset switch (not shown) or by the frame controller resetting the amplitude counter. When the waveform achieves whatever predetermined condition is chosen, a SET pulse sets FF2 of the hold off trigger circuit, which was in its reset state. As a result, the decision change detector 17 is initialized and the time base oscillator 27 is started. Thereafter, the time base oscillator strobes the decision change detector and the time base counter counts the pulses produced by the time base oscillator 27. As the pulses are counted, the output of the time base counter changes, whereby the position of the sweep of the CRT 35 along the horizontal or X-axis changes. If the analog signal voltage crosses the reference voltage, the output of the comparator 11 changes state, whereby the decision change detector produces an ENABLE pulse. The ENABLE pulse causes the memory to receive and store the X and Y axis digital data at an address determined by the address output of the address increment counter 21. If a real time display is desired, a spot is produced on the face of the CRT 35 at the then existing X-Y coordinates. Further, the address increment counter 31 is incremented to a new address value. If the analog signal again crosses the reference signal during the same comparison sequence (sweep), the decision change detector 17 produces another ENABLE pulse, which causes the memory to receive and store the X-Y values at the new address; and, the address increment counter to be incremented again. This comparison sequence continues until the time base counter produces a SWEEP COMPLETE pulse. At the end of the first sweep, when the time base counter 29 produces a SWEEP COMPLETE pulse, the amplitude counter 23 is incremented (whereby the reference voltage is stepped) and FF2 of the hold off trigger circuit is reset. The SWEEP COMPLETE pulse also stops the time base oscillator 27. The next time the analog input signal achieves the predetermined trigger condition, a SET pulse again sets FF2 and the next comparison sequence starts. The waveform digitizer cycles in this manner until the amplitude counter 23 is full. At this point a FRAME COMPLETE pulse is produced. If the SINGLE/CONTINUOUS FRAME CONTROL signal is in a state such that a single frame is to be displayed and/or stored in memory, the INHIBIT output of the frame controller 25 shifts from low to high, whereby G2 of the hold off trigger circuit is disabled, as previously described. Consequently, FF2 cannot be reset. Contrariwise, if the SINGLE/CONTINUOUS FRAME CONTROL signal is in a state such that continuous frames are to be displayed, INHIBIT remains low, whereby G2 is enabled and SWEEP COMPLETE pulses continue to reset FF2. As a result continuous frame cycles occur, as previously described.

As noted above, in addition to resetting the amplitude counter 23 or inhibiting the hold off circuit 33, the frame controller could form part of an over-all controller that controls other operations of the waveform digitizer. For example, the overall controller could control the number of counts counted by the time base counter before the time base counter produces a SWEEP COMPLETE pulse. In this way X-axis resolution, i.e., X-axis grid separation distance, can be controlled. Similarly, the overall controller could control the number of amplitude counts counted by the amplitude counter before the amplitude counter produces a FRAME COMPLETE pulse; and, the increment change in the output of the first D/A converter for each increment in the output of the amplitude counter. In this way, Y-axis resolution, i.e., Y-axis grid separation distance can be controlled. Further, the overall controller could preset and hold the amplitude count at a predetermined value whereby the output of the amplitude counter could be used to merely determine whether or not the analog signal raises above the predetermined value. Such a method of operation could be used for "glitch" detection, for example. Glitches lasting longer than the duration of the clock cycle of the time base oscillator can be readily detected by the waveform digitizer as illustrated. Faster glitches can be detected by connecting two flip-flops to the output of the comparator 11, one of which clocks on a negative going edge and the other of which clocks on a positive going edge. Triggering of both flip-flops within a clock period denotes the occurrance of a glitch.

Still further, the overall controller could control the waveform digitizer such that the digitized form of the analog waveform is only displayed, or only stored in memory, rather than being displayed and stored in memory. In some instances, it may be desirable to continuously display the digitized waveform on the CRT 35 and only store a particular wave shape in memory for later analysis if the displayed waveform has a particular shape or rises above a predetermined value. Alternatively, it may be desirable to only store waveforms in memory for analysis without displaying them as they are being stored. In this regard, if desired, the memory 19 can be made large enough to store a series of waveforms taken from different points of an analog circuit, by starting the address increment counter at a new beginning address for each waveform.

Figure 5:
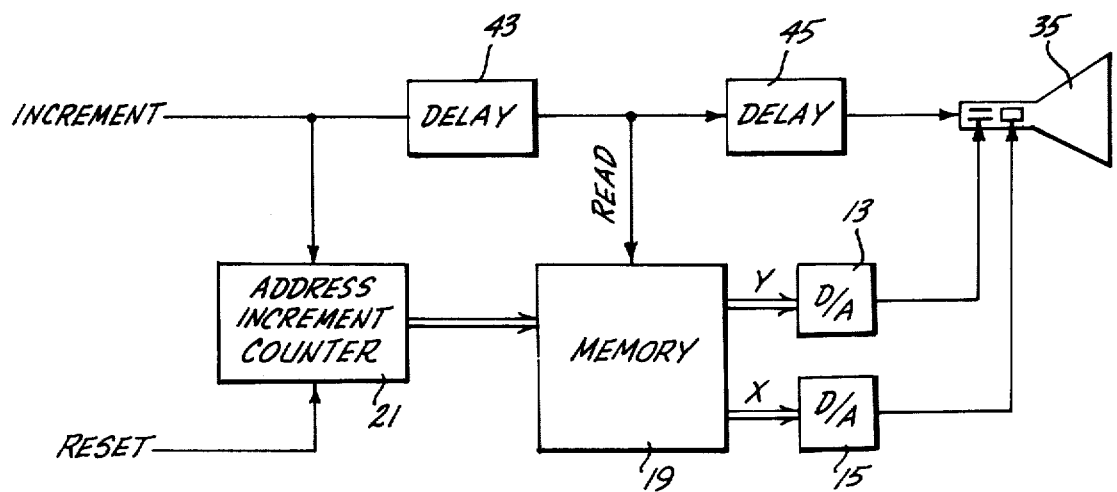
FIG. 5 is a block diagram of a system for reading out data words stored in the memory illustrated in FIG. 2 and using the data words to create a display; and, FIG. 6 is a block diagram of an alternative system for creating and storing waveform defining data words.

FIG. 5 is a block diagram of a subsystem for reading out the data words stored in the memory 19 and using the stored data words to control a display. Alternatively, this subsystem could be used to control the reading out of the stored data for analysis. The subsystem illustrated in FIG. 5 includes the first and second D/A converters 13 and 15; the memory 19; the address increment counter 21; the CRT 35; and, first and second delays 43 and 45. INCREMENT pulses produced by a suitable clock (not shown) are applied to the increment input of the address increment counter 21 and to the first delay. The output of the address increment counter 25 is applied to the address input of the memory 19. The output of the first delay 43 is applied to the read out input of the memory 19 and to the second delay 45. The output of the second delay 45 is applied to control the emission of electrons by the electron gun of the CRT 35. The Y portion of the output of the memory 19 is applied to the input of the first D/A converter 13 and the X portion of the output of the memory 19 is applied to the input of the second D/A converter 15. The output of the first D/A converter 13 is applied to the vertical deflection plates of the CRT tube 35 and, thus, controls the vertical position of the CRT display. The output of the second D/A converter 15 is applied to the horizontal deflection plates of the CRT and, thus, controls the horizontal position of the CRT display.

In operation, as INCREMENT pulses occur, the address increment counter 21 sequentially produces the addresses at which X-Y data is store in the memory 19. After a delay adequate to allow the address increment counter output to stabilize, each INCREMENT pulse enables the read out input of the memory 19, whereby the memory produces the X-Y data stored at the address on the address output of the address increment counter. These X-Y data signals are converted into analog form by the first and second D/A converters 13 and 15; and, after a delay adequate to allow the outputs of the D/A converters to stabilize, each INCREMENT pulse causes the gun of the CRT to emit electrons and create a spot. Since the addresses are related to the X-Y positions of the waveform originally stored in the memory that waveform is reproduced on the CRT. After a complete frame has been displayed, the address increment counter 21 receives a suitable RESET pulse. The RESET pulse can be produced by, for example, counting the number of INCREMENT pulses and causing a RESET pulse to occur when the number of INCREMENT pulses reaches a value equal to the maximum number of addresses that can be produced by the address increment counter or the maximum number of bins that are available in the memory 19 for storing data. Alternatively, a detector can be connected to the output of the memory to detect when an empty location is addressed. When such a location is detected, the detector could produce a RESET pulse for resetting the address increment counter 21.

It will be readily appreciated that the memory can be read out at a much faster rate than data can be written therein because the latter rate is controlled by the repetition rate of the analog signal whose waveform is to be digitized (which may be slow), while the former is controlled by the rate at which the display can be controlled (which is relatively rapid). Consequently, while a relatively slow analog signal may be digitized and stored by the invention, the signal can be read out and displayed at a much faster rate to avoid display flicker.

It is pointed out here that delays of the type illustrated in FIG. 5 are also required in the waveform digitizer illustrated in FIG. 2 to provide signal settling time. Such delays were not illustrated in order to avoid unduly complicating the drawing and description, and because their inclusion will be apparent to persons skilled in the digital electronics art. For similar reasons, convention well known conditioning and the like circuits and elements have not been illustrated in the drawings and described, even though such elements are necessary to create an actual embodiment of the invention.

Figure 6:
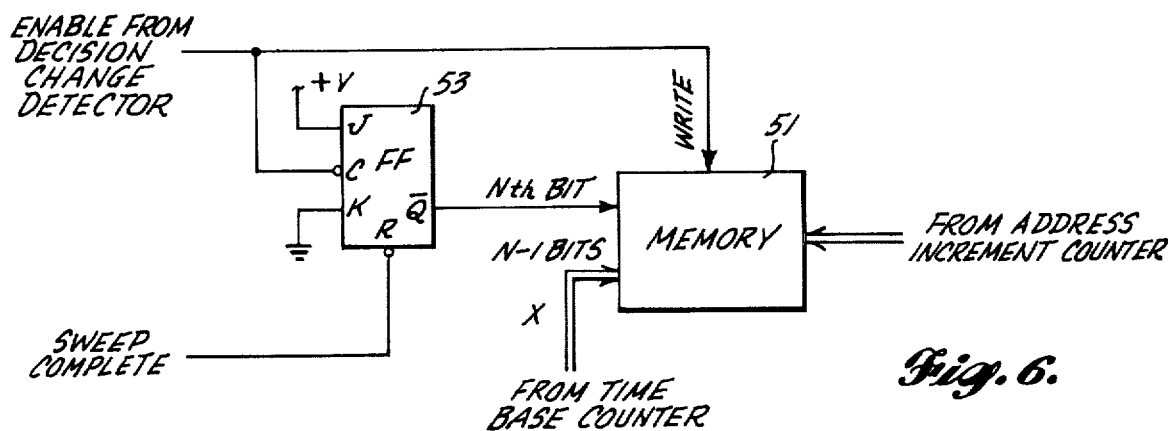

It will be appreciated that the memory 19 illustrated in FIGS. 2 and 5 must have a relatively large storage capacity. If, for example, the X and Y digital data signals are each eight (8) bit binary signals, the memory must have a sixteen (16) input capacity. FIG. 6 illustrates how the system illustrated in FIG. 2 can be modified such that the same data can be stored in a memory of substantially lesser capacity. Specifically, the subsystem illustrated in FIG. 6 allows a nine (9) but memory to store, in essence, the same information that is stored in a sixteen (16) bit memory utilizing a system of the type illustrated in FIG. 2.

The subsystem illustrated in FIG. 6 includes a memory 51 and a JK flip-flop 53. These two components replace the memory 19 illustrated in FIG. 2. The J input of the JK flip-flop is tied to a positive voltage source designated +V and the K input is tied to ground. SWEEP COMPLETE pulses produced by the time base counter 29 are applied to the reset (R) input of the JK flip-flop 53 and the ENABLE pulses produced by the decision change detector 17 are applied to the clock (C) input of the JK flip-flop and to the write enable input of the memory 51. The $\overline{Q}$ output of the JK flip-flop 53 is applied to the Nth (e.g., 9th) bit input of the memory 51 and the parallel digitial output of the timebase counter is applied to the N-1 bit (e.g., bits 1 to 8) inputs of the memory 51. The output of the address increment counter 21 is applied to the address input of the memory 51.

Each time a SWEEP COMPLETE pulse occurs, the JK flip-flop 53 is reset, whereby the $\overline{Q}$ output is placed in a binary one state. The first ENABLE pulse produced by the decision change detector a comparison (sweep) sequence clocks the JK flip-flop 53 whereby its $\overline{Q}$ output shifts from a binary one state to a binary zero state. For the remainder of the comparison sequence, the JK flip-flop remains set (i.e. $\overline{Q}$ output remains in a binary zero state). At the end of the comparison sequence, the JK flip-flop is reset by the SWEEP COMPLETE pulse. Thus, the stored data includes an indication of reference voltage changes, but not the actual digital value of the reference voltage. However, all of the data necessary to reproduce the stored waveform is actually stored in the memory. In this regard, when the memory is read, the Nth bit value is used to control the vertical position of the display by simply incrementing a Y-axis counter each time the Nth bit shifts from zero to one, which occurs once for each sweep line during which the analog signal crosses the reference voltage. The output of the Y-axis counter is applied to a D/A converter connected to the vertical deflection plates, as previously described. The X address read out at each address controls the horizontal position of the display, as also previously described.

While a preferred embodiment of the invention has been illustrated and described, it is to be understood that various changes can be made therein without departing from the spirit and scope of the invention. For example, for simplicity of illustration, an electrostatic (oscilloscope type) CRT display has been illustrated. In an actual embodiment of the invention, such a display would, in all likelihood, not be the most preferred display because oscilloscope CRT displays require custom high voltage power supplies to provide the high deflection voltages needed and because the low volume production of such tubes makes their cost relatively high. Rather, in many instances, a raster scan magnetic deflection (TV type) CRT display, plus the control logic commonly found in display terminals, will be more preferred. Moreover, as discussed above, the most preferred way of using the invention is to combine it with a logic analyzer to produce an combination or hybrid analyzer that can be used to analyze signals produced by both analog and digital circuitry. As will be readily recognized by those skilled in the electronic test art, such systems can be automatically programmed to digitize the waveforms of analog signals in a manner such that they can be readily compared with predetermined reference signals in a conventional digital comparison system of the type normally found in logic analyzers. While the preferred use of the invention in such an environment, obviously the invention can be utilized in other environments. Thus, it is to be understood that the invention can be practiced otherwise than as specifically described herein.

The embodiments of the invention in which an exclusive property or privilege is claimed are defined as follows:

1. A waveform digitizer for digitizing analog signals comprising:
    reference voltage means for sequentially producing a series of digitallyderived reference voltages one-at-a-time, each reference voltage having a different voltage value;
    comparison means coupled to said voltage reference means for sequentially comparing each of said series of digitally derived reference voltages with an analog signal whose waveform is to be digitized during a series of comparison sequences and producing a comparison pulse each time said reference voltage and the analog signal voltage cross during said comparison sequences;
    timing means starting at the beginning of each comparison sequence for continuously producing a digital time signal during each comparison sequence; and,
    combining means coupled to said comparison means and said timing means for receiving said comparison pulses and said digital time signal and developing a digital word each time a comparison pulse is received, said digital word having a portion related to the value of the digitally derived reference voltage produced by said reference voltage means and a position related to the digital time signal present when said comparison pulse is received.

2. A waveform digitizer as claimed in claim 1 wherein said timing means comprises a time base oscillator started at the beginning of each comparison sequence and a time base counter for counting the output of said time base oscillator, said time base counter producing, in addition to said digital time signal, an output signal when said time base counter has counted up to a predetermined value.

3. A waveform digitizer as claimed in claim 2 wherein said reference voltage means comprises an amplitude counter and a first digital-to-analog converter connected to the output of said digital-to-analog amlitude counter, the output of said digital-to-analog converter forming said series of digitally derived reference voltages, the increment input of said amplitude counter connected to receive the output signal produced by said time base counter when said time base counter has counted up to said predetermined value.

4. A waveform digitizer as claimed in claim 3 wherein said comparison means comprises:
    a comparator having one input connected to receive said analog signal and the other input connected to receive said series of digitally derived reference voltages; and,
    a decision change detector connected to the output of said comparator for producing said comparison pulse when the analog signal voltage crosses said reference voltage during a comparison sequence.

5. A waveform digitizer as claimed in claim 4 wherein said combining means comprises:
    an address increment counter having its increment input connected to the output of said decision change detector; and,
    a memory, the signal inputs of said memory connected to the output of said amplitude counter and the output of said time base counter carrying said digital time signal, the write input of said memory connected to the output of said decision change detector and the address inputof said memory connected to the output of said address increment counter.

6. A waveform digitizer as claimed in claim 4 wherein said combining means comprises:
    an address increment counter having its increment input connected to the output of said decision change detector;
    a flip-flop having one override control input connected to the output of said time base counter produced when said time base counter has counted up to said predetermined value and its clock input connected to the output of said decision change detector; and,
    a memory having its signal input connected to one output of said flip-flop and to the output of said time base counter carrying said digital time signal, its address input connected to the output of said address increment counter and its write input connected to the output of said decision change detector.

7. A waveform digitizer as claimed in claim 4 wherein said timing means also includes:
    a time base trigger circuit, connected to receive a trigger condition signal and a trigger signal, for producing a set pulse when said trigger signal complies with the condition set by said trigger condition signal; and, a hold off trigger circuit connected to receive the set pulses produced by said time base trigger circuit, said hold off trigger circuit connected to said decision change detector so as to initialize said decision change detector and to said time base oscillator so as to start said time base oscillator upon the receipt of a set pulse from said time base trigger circuit, said hold off trigger circuit connected to said time base counter so as to be reset when said time base counter produces said output signal produced by said time base counter when said time base counter has counted up to said predetermined value.

8. A waveform digitizer as claimed in claim 5 wherein said combining means also comprises:
- a second digital-to-analog converter havings its input connected to the output of said time base counter carrying said digital time signal; and,
- a X-Y display means having one of its X-Y control inputs connected to the output of said first digital-to-analog converter and the other of its X-Y control inputs connected to the output of said second digital-to-analog converter and having its image control input connected to the output of said decision change detector.

9. A waveform digitizer as claimed in claim 6 wherein said combining means comprises:
- a second digital-to-analog converter havings its input connected to the output of said time base counter carrying said digital time signal; and,
- a X-Y display means having one of its X-Y control inputsconnected to the output of said first digital-to-analog converter and the other of its X-Y control inputs connected to the output of said second digital-to-analog converter and having its image control input connected to the output of said decision change detector.

10. A waveform digitizer as claimed in claim 7 including a frame controller connected to the said amplitude counter so as to receive a signal when said amplitude counter counts up to a predetermined value and in accordance therewith reset said amplitude counter and inhibit said hold off trigger circuit.

* * * * *